United States Patent
Carullo

(10) Patent No.: US 7,234,960 B2
(45) Date of Patent: Jun. 26, 2007

(54) GUIDE PIN WITH TRANSVERSE PROTRUSIONS FOR PROPERLY POSITIONING A GUIDE PIN FOR ATTACHMENT TO A PRINTED CIRCUIT BOARD

(75) Inventor: Thomas J. Carullo, Marlton, NJ (US)

(73) Assignee: Computer Network Technology Corporation, Minneapolis, MN (US)

( * ) Notice: Subject to any disclaimer, the term of this patent is extended or adjusted under 35 U.S.C. 154(b) by 0 days.

(21) Appl. No.: 10/873,375

(22) Filed: Jun. 21, 2004

(65) Prior Publication Data

US 2005/0282427 A1    Dec. 22, 2005

(51) Int. Cl.
  *H01R 13/64* (2006.01)
(52) U.S. Cl. .................................... 439/378
(58) Field of Classification Search ............ 439/378, 439/379, 380, 64, 374, 573
  See application file for complete search history.

(56) References Cited

U.S. PATENT DOCUMENTS

| 3,835,877 | A | * | 9/1974 | Rietzler ................. 139/207 |
| 4,470,660 | A | | 9/1984 | Hillegonds et al. ........ 385/58 |
| 4,534,611 | A | * | 8/1985 | Wohlfart ................ 439/746 |
| 4,664,458 | A | * | 5/1987 | Worth ................... 439/82 |
| 4,684,203 | A | * | 8/1987 | Bihler .................. 439/751 |
| 5,125,849 | A | * | 6/1992 | Briggs et al. ........... 439/378 |
| 5,478,247 | A | * | 12/1995 | Chen et al. ............. 439/65 |
| 5,975,914 | A | * | 11/1999 | Uchida ................. 439/66 |
| 6,074,235 | A | * | 6/2000 | Brandberg et al. ........ 439/378 |
| 6,395,976 | B1 | | 5/2002 | Koradia et al. ........... 174/35 |
| 6,431,920 | B1 | * | 8/2002 | Endres et al. ............ 439/717 |
| 6,561,836 | B1 | * | 5/2003 | Marshall et al. .......... 439/378 |
| 6,716,060 | B2 | * | 4/2004 | Gollhofer et al. ......... 439/567 |

* cited by examiner

*Primary Examiner*—Chandrika Prasad
(74) *Attorney, Agent, or Firm*—Beck & Tysver, PLLC

(57) ABSTRACT

A self-aligning guide pin has two tapered protrusions. The protrusions seat in recesses in a printed circuit board to properly position and align the guide pin as it is mounted by a screw to the printed circuit board during assembly.

29 Claims, 8 Drawing Sheets

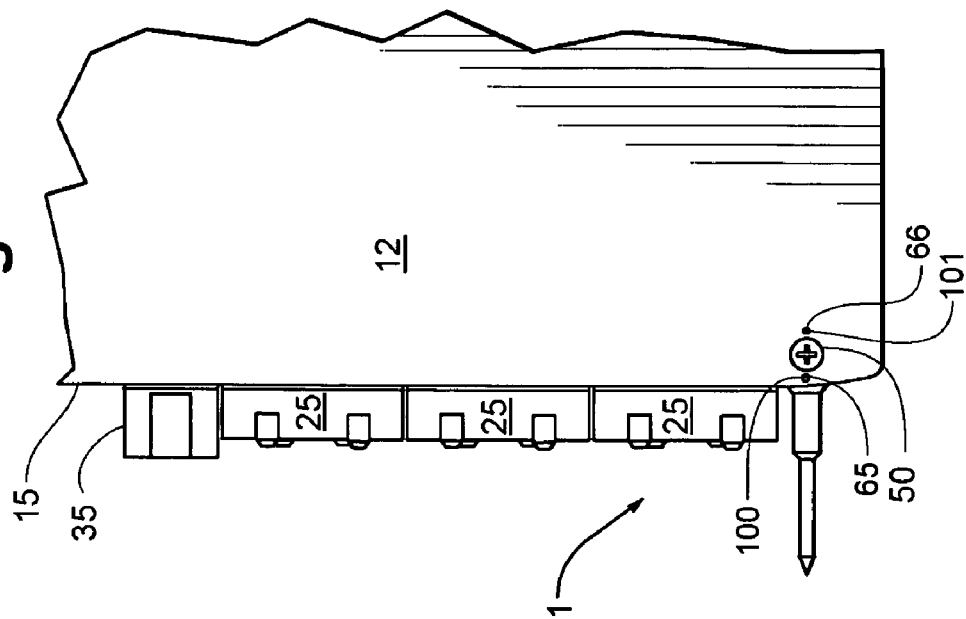
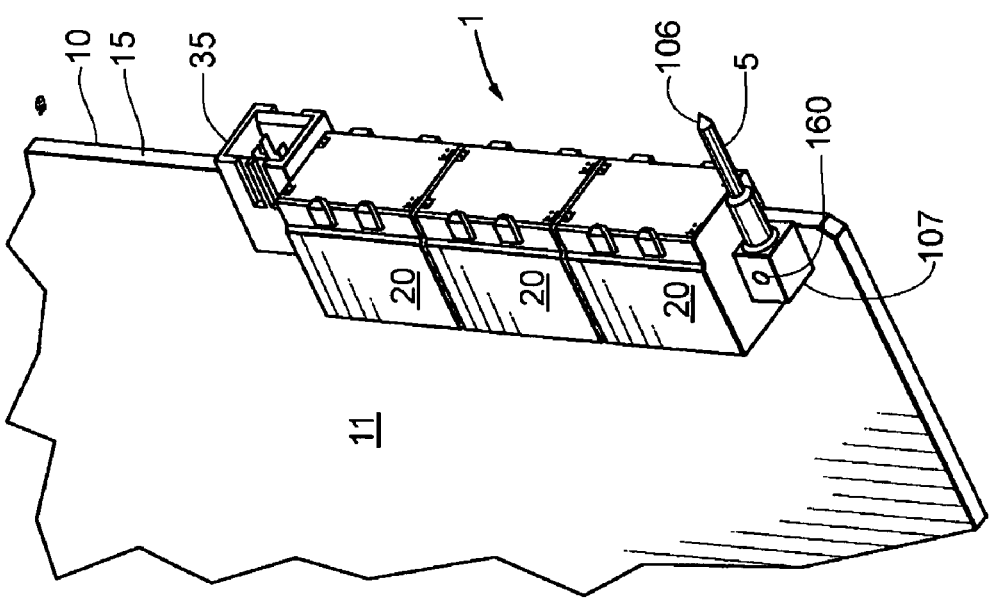

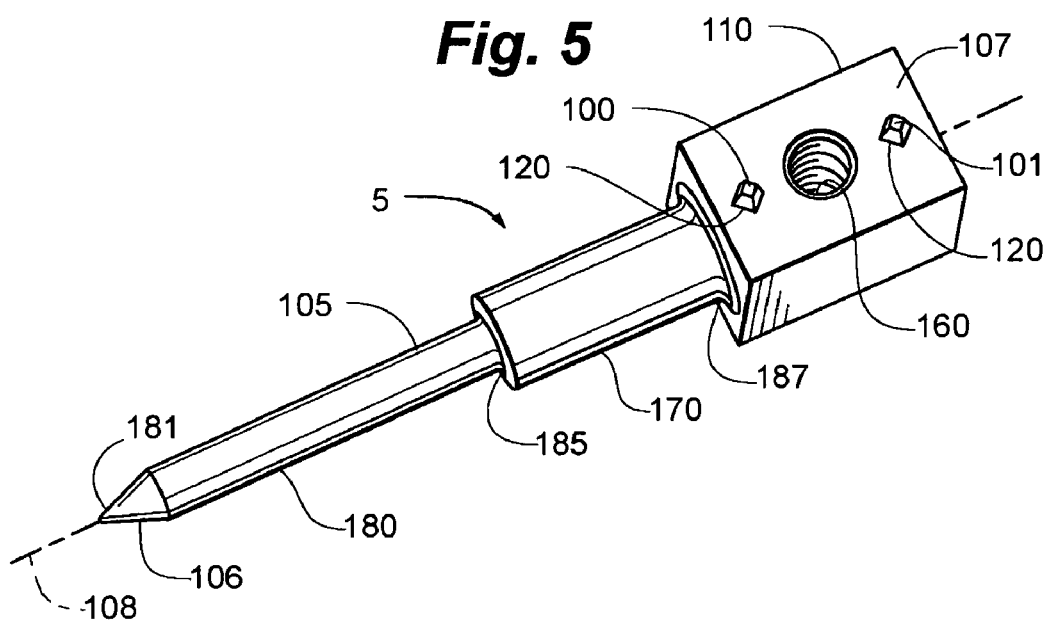
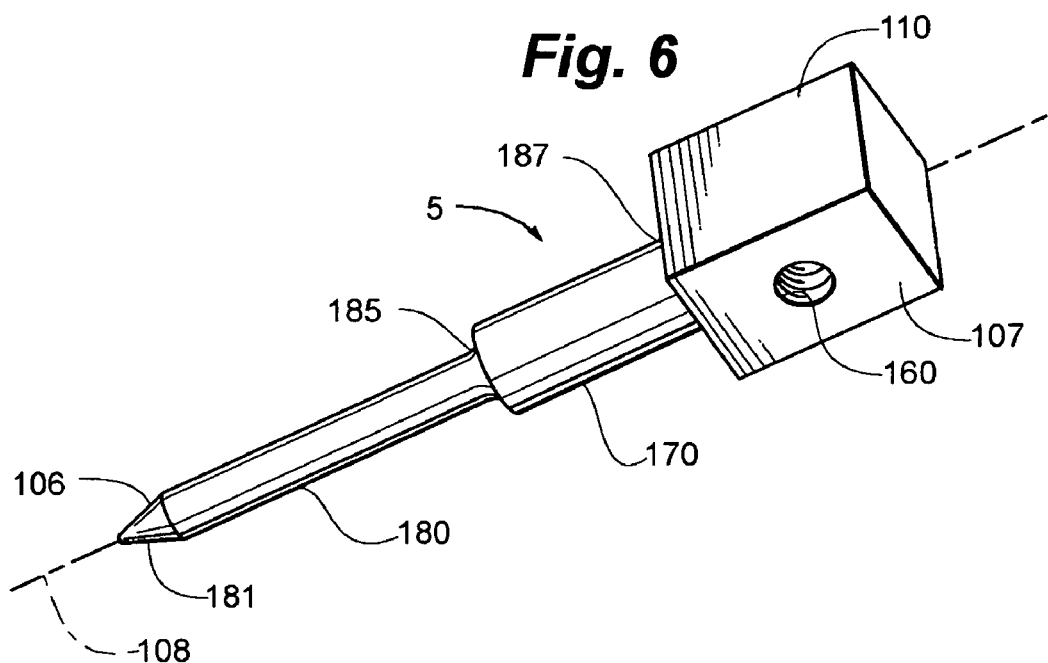

GUIDE PIN WITH TRANSVERSE PROTRUSIONS FOR PROPERLY POSITIONING A GUIDE PIN FOR ATTACHMENT TO A PRINTED CIRCUIT BOARD

FIELD OF THE INVENTION

The present invention relates generally to a guide pin and guide pin assembly for reliably locating and aligning a guide pin in the proper position and orientation on a printed circuit board, where the guide pin is subsequently used for aligning two printed circuit boards for mating connection. More particularly, the present invention relates to a guide pin having tapered protrusions for engaging mating recesses in a printed circuit board. Further, the invention relates to a method of attaching a guide pin to a printed circuit board in proper location and orientation.

BACKGROUND OF THE INVENTION

It is typical for a printed circuit board to connect to another component, such as another printed circuit board, via mating high density connectors to allow transfer of digital information therebetween. Historically, it has been a challenging task to prevent mating high density connectors from being damaged due to misalignment when adjoining circuit boards are connected to one another. Often one printed circuit board is used as a mobile assembly, while the adjoining printed circuit board is typically affixed to a chassis. Many of these mobile printed circuit board assemblies are inserted into chassis guides or slots that support the edges of the circuit board and are not accurate enough to prevent connectors from being damaged during the connectivity process. Another historical problem is that numerous mobile printed circuit board assemblies are large and must be installed blindly, meaning that the installer does not have the visibility to ensure that each connector is aligned properly during the insertion cycle.

Although various printed circuit board designs use guide pins to assist with alignment issues, the way existing guide pins are designed is inherently not accurate enough to prevent connector damage. Many problems exist: guide pins are typically installed imprecisely during the initial assembly process; in addition, many guide pins shift during handling due to the way they are attached to the printed circuit board. This is typically a function of how a guide pin is designed. When multiple screws are used to attach a single guide pin to the printed circuit board, each mounting hole and the distance between mounting holes inherently have manufacturing tolerances and clearances requirements that prevent ever getting an accurate placement.

SUMMARY OF THE INVENTION

An object of the present invention is to mount a guide pin to a printed circuit board in a precise, reliable manner without undo hardware that would require tightening during manufacturing. It is a further object of the present invention to mount a guide pin to a printed circuit board using simple, easily manufactured protrusions on the guide pin and mating recesses in the circuit board to thereby avoid more complex fixturing. It is still another object of the present invention to mount a guide pin to a printed circuit board such that the guide pin positions and aligns itself precisely as it is installed on the printed circuit board without time-consuming positioning steps or alignment verification steps.

These and other objectives for securing a guide pin to a printed circuit board are achieved via a guide pin bearing tapered protrusions extending transversely to the shaft of the guide pin. In a guide pin assembly, these protrusions mate with recesses in a printed circuit board and their interaction assists in positioning the guide pin in the properly aligned position on the circuit board. A screw extends through the guide pin and engages the printed circuit board thereby fixing the guide pin to the printed circuit board. As the screw is tightened, the tapered protrusions are pulled deeper into the mating recesses on the board and edges of the tapered protrusions bite into the material forming the board. This assures proper alignment of the guide pin in relation to the circuit board and firmly prevents rotation of the pin with respect to the board.

A method of locating and aligning a guide pin on a printed circuit board is also described.

BRIEF DESCRIPTION OF THE DRAWINGS

An exemplary version of a guide pin and a guide pin assembly is shown in the figures wherein like reference numerals refer to equivalent structure throughout, and wherein:

FIG. 1 is a top perspective view of a portion of a printed circuit board with a guide pin assembly;

FIG. 4 is a side view of the printed circuit board of FIG. 1, showing the face of the circuit board opposite the face shown in FIG. 1;

FIG. 5 is an enlarged perspective view of a guide pin like that shown in the guide pin assembly in FIG. 1;

FIG. 6 is an enlarged perspective view of the guide pin of FIG. 5, showing the opposite side of the pin;

DETAILED DESCRIPTION OF PREFERRED EMBODIMENT(S)

Figure 2:
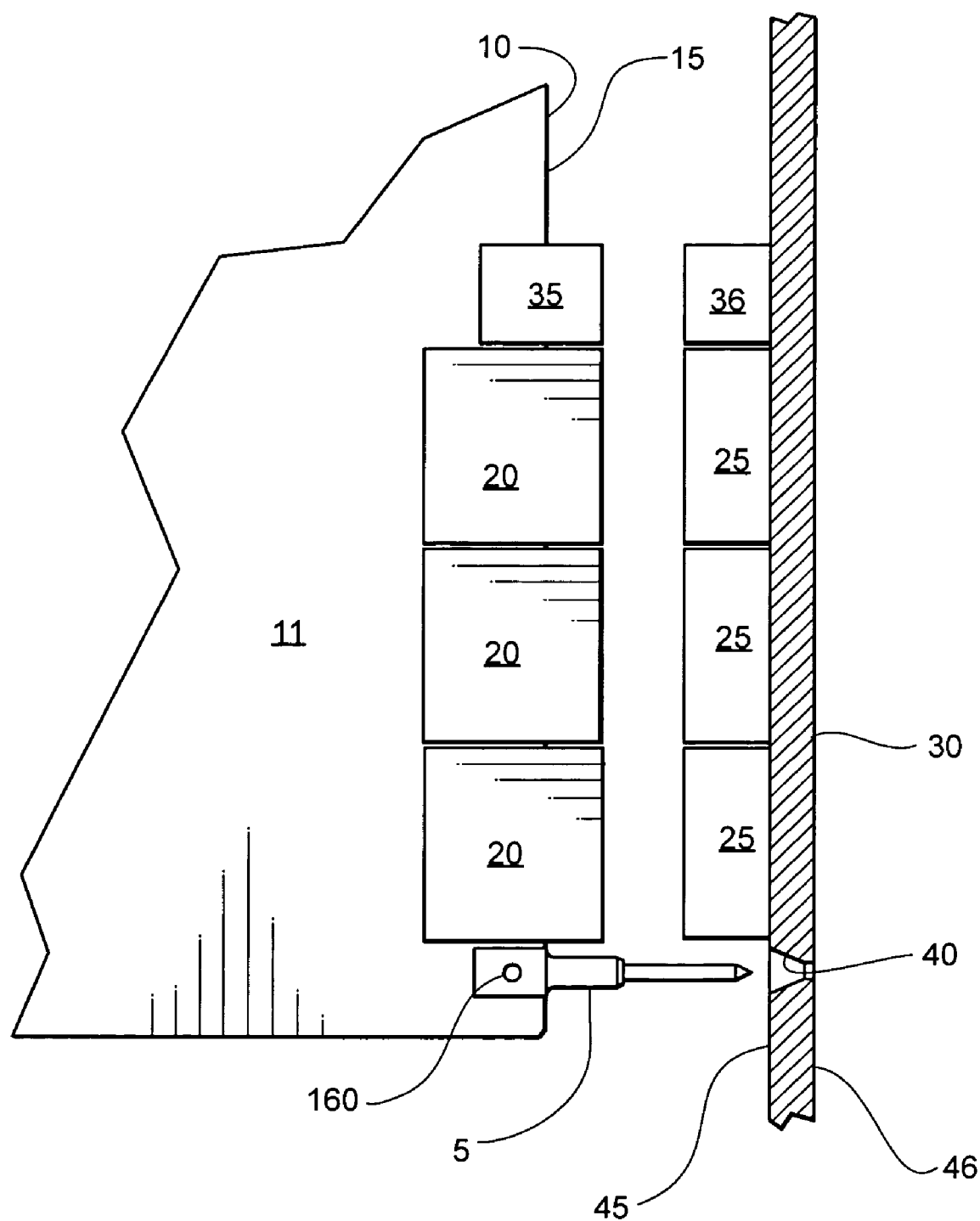
FIG. 2 is a side exploded view of the printed circuit board of FIG. 1 mated with a second printed circuit board.

FIG. 1 shows a guide pin assembly 1 including a guide pin 5 mounted on a printed circuit board (PCB) 10. The PCB 10 is generally planar having first and second opposite faces 11, 12. Along an edge 15 of a typical PCB are one or more high density connectors 20. These connectors 20 plug into or connect with mating connectors 25 on another component, such as a printed circuit board 30 to allow data transmission therebetween, as illustrated in FIG. 2. It is typical for a PCB to connect to a backplane or midplane that in turn is mounted in a chassis. The PCBs 10, 30 also include mating power connectors 35, 36 transporting power from one to the other.

Figure 10:
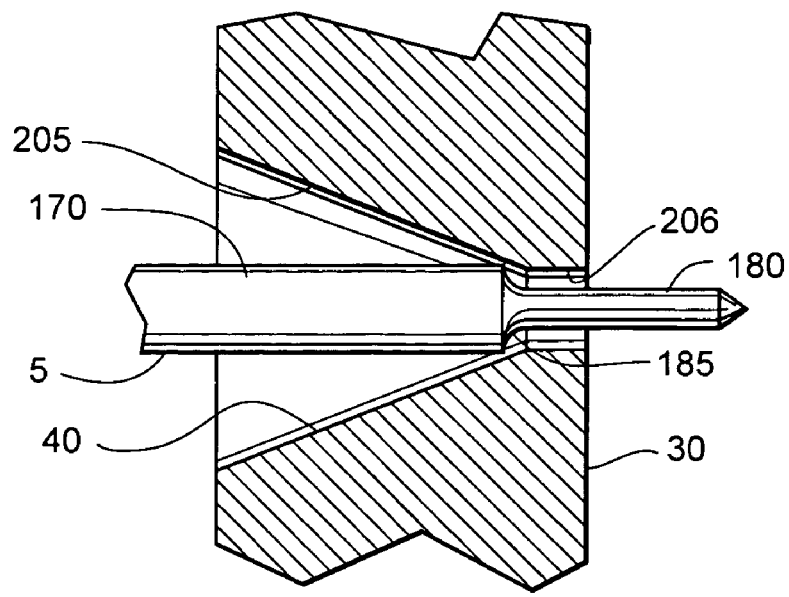
FIG. 10 is an enlarged cross-sectional view of a portion of the second printed circuit board of FIG. 2.

The second PCB 30 defines an aperture 40 for receiving the guide pin 5 therein. The aperture 40 is tapered, being larger on the face 45 of the board 30 that is adjacent the first PCB 10 than it is on the face 46 of the board 30 opposite the first PCB. This is illustrated in greater detail in FIG. 10, discussed below.

The guide pin 5 is attached to the PCB 10 by a mounting screw 50. The assembly 1 of the guide pin 5 on the PCB 10 via the mounting screw 50 is illustrated by the exploded view shown in FIG. 3. PCB 10 defines three pertinent recesses, holes or aperatures 60, 65, 66. Hole 60 is sized to be a clearance hole for the mounting screw 50. Recesses 65, 66 are circular and are sized to accommodate protrusions 100, 101 on the guide pin 5 in a manner that will be described in greater detail below.

FIG. 4 shows the guide pin assembly 1 from the face 12 opposite the face 11 illustrated in FIG. 1. The head of the screw 50 resides adjacent face 12.

The guide pin 5 is described in greater detail with reference to FIGS. 5 and 6. The guide pin 5 is generally an elongate shaft member 105 having first and second opposite ends 106, 107. The longitudinal axis of the shaft member 105 is indicated by centerline 108. An attachment section 110 of the pin 5 is located adjacent end 107. This attachment section 110 includes structural details for attaching the pin 5 to a PCB 10. Protrusions 100, 101 extend from the shaft member 105, or more specifically from the surface of the attachment section 110, in a direction that is generally perpendicular to the longitudinal axis 108 of the shaft 105.

Figure 7:
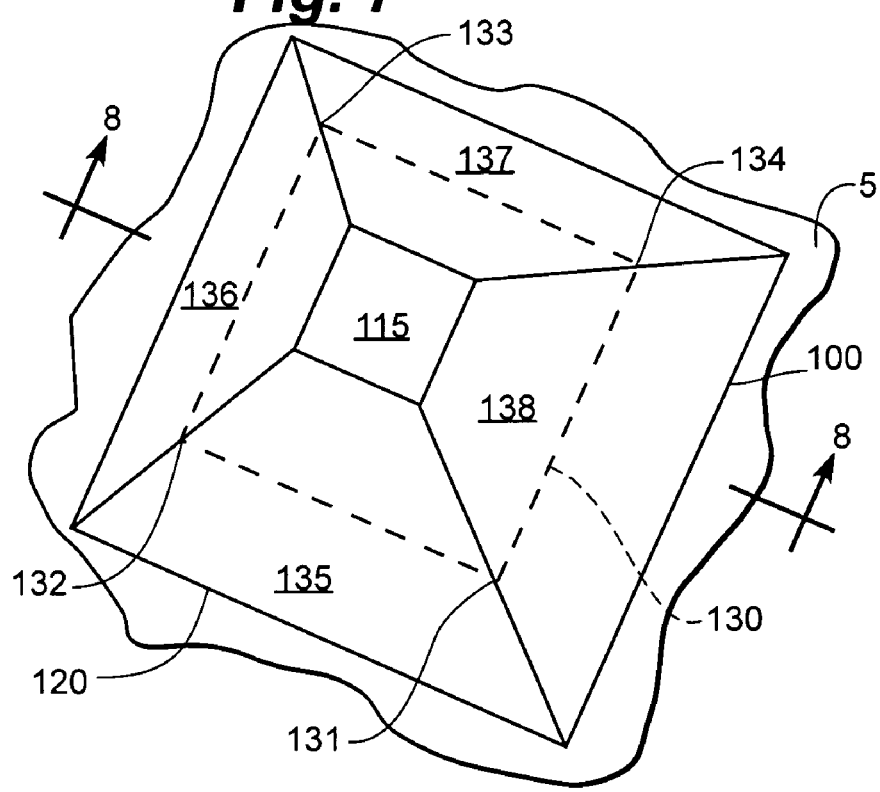
FIG. 7 is an enlarged top perspective view of a portion of the guide pin of FIGS. 1 and 5.
Figure 8:
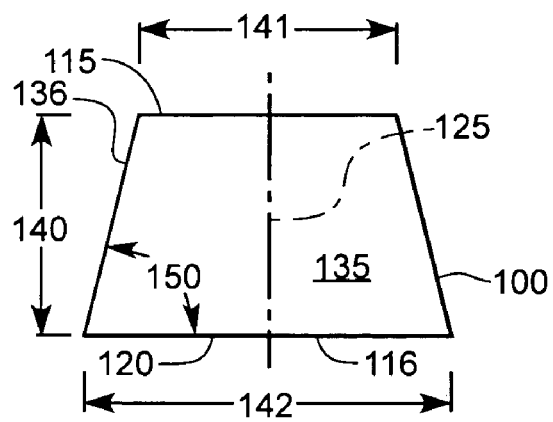
FIG. 8 is an enlarged side view of a portion of the guide pin of FIG. 5.
Figure 9:
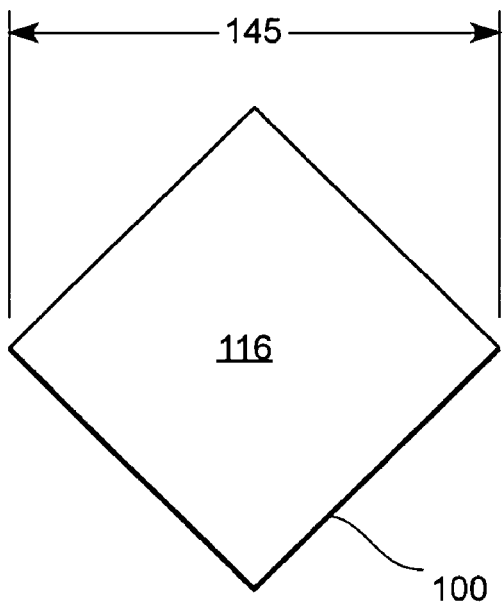
FIG. 9 is an enlarged diagrammatic bottom view of the guide pin of FIG. 7.

For reference sake, FIGS. 7–9 present geometric properties of a preferred embodiment of a protrusion 100. The protrusion 100 includes a terminating face 115. FIGS. 8 and 9 are simply schematic and suggest that the protrusion 100 has a face 116 opposite the terminating face 115. In a preferred embodiment, the protrusion 100 is integral with the shaft 105, or more specifically the face of the attachment section of the shaft, such that there is no second face 116. Face 116 is better understood as the base 120 of the protrusion, having the largest circumference of any other part of the protrusion 100, and including the largest diameters in the protrusion 100.

A longitudinal or anterior-posterior axis 125, FIG. 8, extends through the protrusion 100, generally perpendicular to faces 115, 116. This axis 125 is generally perpendicular to the shaft axis 108. The distance between the longitudinal axes 125 of the two protrusions is the same as the distance between the recesses 65, 66 from center to center.

A preferred embodiment of the protrusions 100, 101 is frusto-pyramidical. That is, the protrusion 100, 101 is tapered in the direction of the longitudinal axis 125 from a largest circumference and diameter at base 120 to the smallest circumference and diameter at terminating face 115. The angle 150 of the taper is indicated in FIG. 8. The preferred angle is between about 100 and 108 degrees.

A further characteristic of the preferred frusto-pyramidical shape is that the preferred transverse cross-sectional plane is square and includes four defined corners 131, 132, 133, 134 at the intersection of four planar, trapezoidal faces, 135, 136, 137, 138. A dotted line in FIG. 7 indicates a representative transverse cross-sectional plane 130. The plane 130 lies perpendicular to the longitudinal axis 125. While the frusto-pyramidical shape is preferred, other shapes 100', 100'', 100''', 100'''' are contemplated and are discussed below with respect to FIGS. 12a–d.

FIG. 8 shows a side view of the protrusion 100 taken along section line 8—8 in FIG. 7. FIG. 8 illustrates a height dimension 140, which might also be considered a length dimension; a width dimension 141 for the smaller face 115; and a width dimension 142 for the base face 116 of the protrusion 100. FIG. 9 illustrates a width dimension 145 from corner to corner, i.e. the largest width dimension in the protrusion, across the base face 116. There is an analogous corner-to-corner width for the smaller end face 115 which is not illustrated. Because of the tapered shape of the protrusion 100, the end face 115 is smaller in the corner-to-corner dimension than the corner-to-corner dimension 145 of the base 120.

Turning again to FIGS. 5 and 6, the guide pin 5 defines a hole or aperture 160 therethrough for receiving the mounting screw 50. In a preferred embodiment, this hole 160 is sized and tapped to mate with the threads of the screw 50. The aperture lies between the protrusions 100, 101 along a line extending transversely between the two protrusions 100, 101 that is generally parallel to the shaft axis 108.

Along the length of the shaft 105 are sections having varying widths or diameters. As noted above, an attachment section 110 resides at one end 107 of the pin 5. This section has the greatest diameter to allow clearance for the opposite end 106 of the pin 5 when the pin 5 is attached to the PCB 10. Adjacent the attachment section 110 is a middle section 170. Adjacent the end 106 is a guide section 180. Guide section 180 terminates in a tapered pointed end 181. The sections 180, 170, 110 incrementally increase in diameter from end 106 to end 107. A shoulder 185 bridges the middle section 170 and the guide section 180; a shoulder 187 bridges section the middle section 170 and the attachment section 110.

Figure 3:
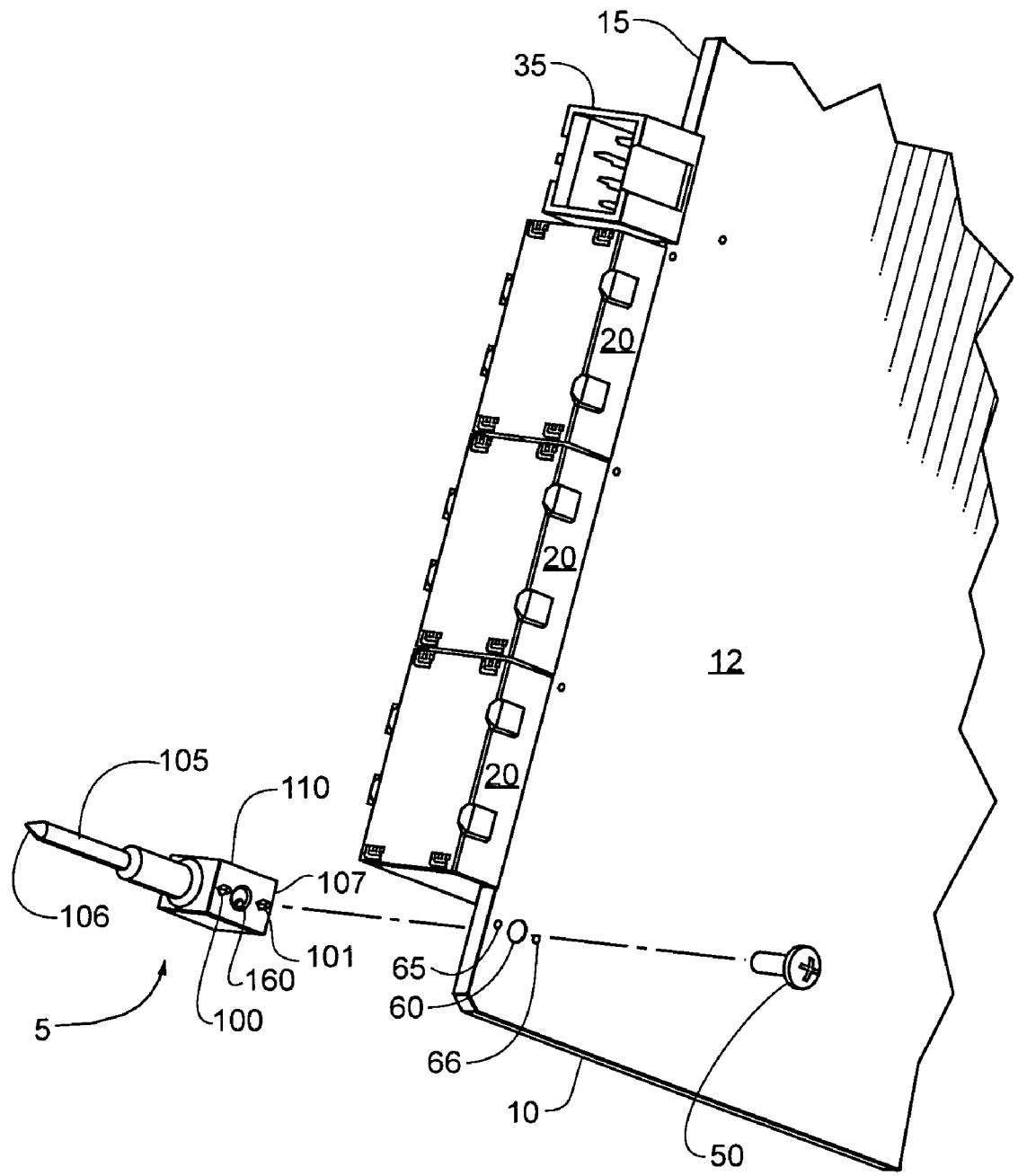
FIG. 3 is an exploded view of the guide pin assembly of FIG. 1, illustrating how a guide pin is attached to a printed circuit board.
Figure 11:
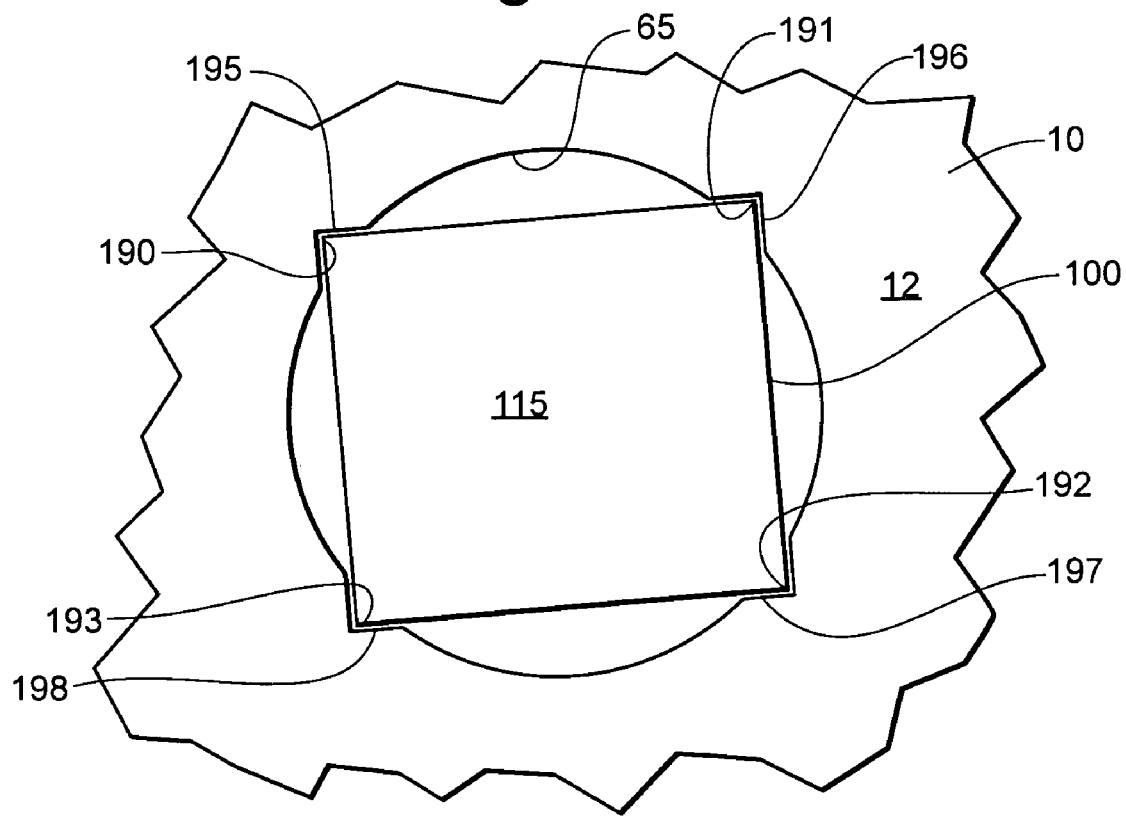
FIG. 11 is an enlarged bottom view of a guide pin protrusion mating with a recess in a printed circuit board as illustrated in FIG. 1.
Figure 12A:
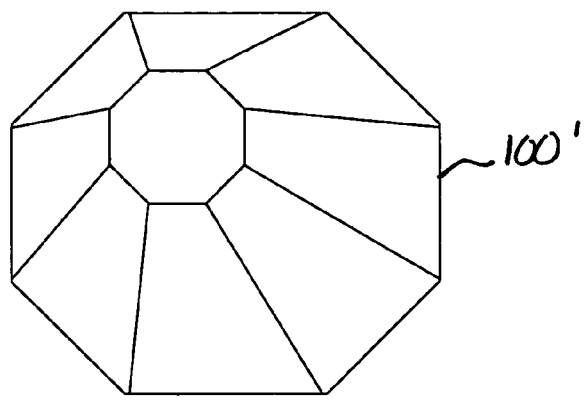
FIGS. 12a–d are top view of alternative embodiments of a protrusion for a guide pint.
Figure 12B:
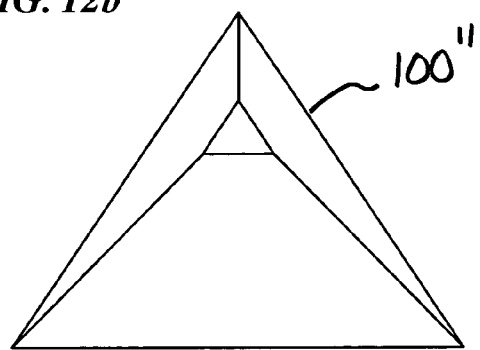
Figure 12C:
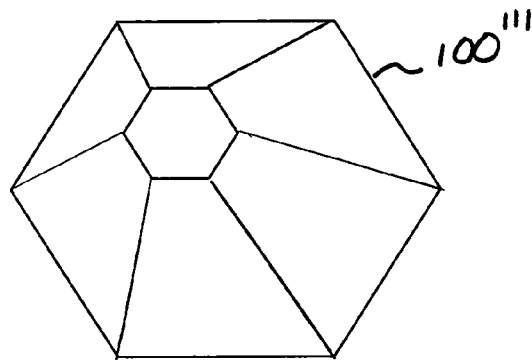
Figure 12D:
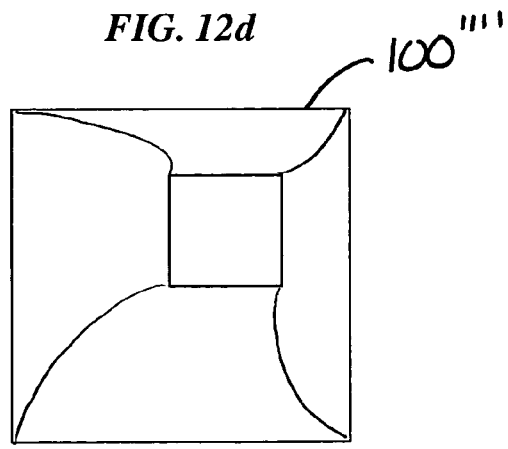
Figure 13:
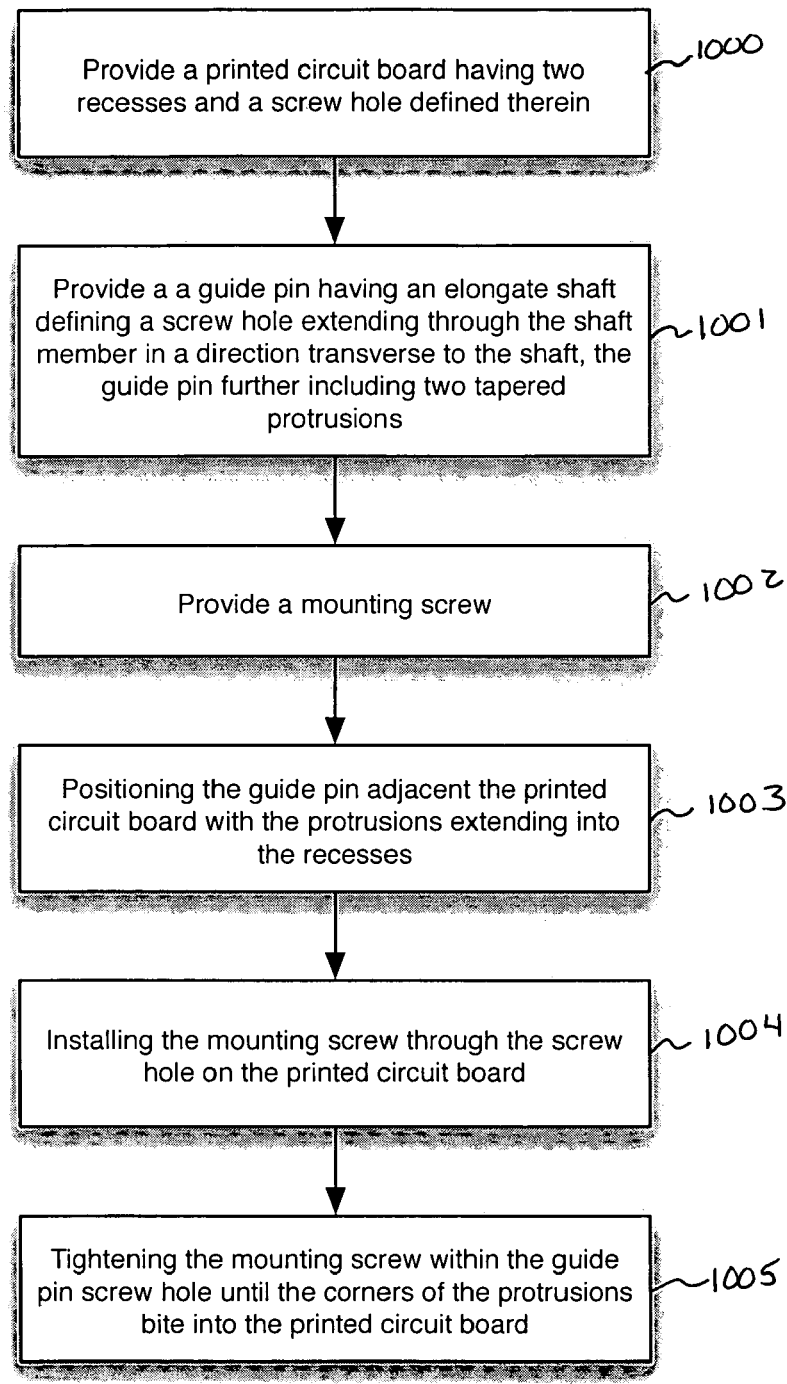
FIG. 13 is a flow chart of the method of attaching a guide pin to a printed circuit board in the manner depicted in FIG. 3.

The operation of the protrusions 100, 101 during the mounting of the guide pin 5 to the PCB 10 is now described with reference to FIGS. 3, 11 and 13. To mount the guide pin 5 (step 1001, FIG. 13) on the PCB 10 (step 1000, FIG. 13) with the pin's longitudinal axis 108 precisely and reliably positioned and oriented in the proper direction, the guide pin 5 is placed on the PCB 10 with its protrusions 100, 101 adjacent the face 12 of the PCB 10 (step 1003, FIG. 13). Protrusions 100, 101 are roughly aligned with the recesses 65, 66 on the PCB 10. This provides rough registration for the screw hole 60 on the PCB 10 with the screw hole 160 on the guide pin 5 (step 1004, FIG. 13). The screw 50 (step 1002, FIG. 13) is then tightened, such that its threads engage the threads in the tapped hole 160 on the guide pin, thereby pulling the guide pin 5 closer to the PCB 10. As the screw 50 is tightened, the protrusions 100, 101 are pulled into their respective recesses 65, 66. Eventually, as illustrated in FIG. 11, the portions 190, 191, 192, 193 of the corners of the tapered protrusion 100, 101 bite into contacting portions 195, 196, 197, 198 of the recesses 65, 66 of the PCB 10 (step 1005, FIG. 13). In this manner, the guide pin 5 is precisely registered and aligned on the PCB 10. Further, the pin 5 is secured against rotational force.

It will be appreciated from the description of the biting action of the corners of the protrusions into the walls of the recesses 65, 66 of the board 10 that the board 10, or at least the areas of the board defining the recesses 65, 66, is made of a material that is softer than the material of the guide pin protrusions 100, 101. In a preferred embodiment, the PCB 10 is of a plastic material, typically FR4; the guide pin with its protrusions are made of stainless steel. The guide pin protrusions are formed on the guide pin via metal injection molding.

It will be further appreciated that it is advantageous for the base 120 of the protrusions 100, 101 to be greater than the diameter of the mating recesses 65, 66, and for the face 115 to be smaller than the recesses 65, 66.

In addition, it will be appreciated that due to the tapered shape of the protrusions, the tolerances for the dimensions of the protrusions are not important. Similarly, because recesses 65, 66 are not clearance holes, their tolerances are not important. As a result, fabrication or manufacturing is simple and the potential for error is minimized.

Still further, it will be appreciated that the self-aligning nature of the tapered protrusions having equally spaced corners yields manufacturing efficiency in the assembly of the guide pin 5 and the printed circuit board 1. This is of particular value when guide pins are installed on a volume of printed circuit boards.

It is noted that properly locating the recesses 65, 66 on the PCB 10, and properly positioning the tapered protrusions 100, 101 on the guide pin 5 is important for yielding a properly positioned guide pin 5. This is easily accomplished. The recesses 65, 66 are drilled in the PCB, along with the screw hole 60, by using a computer-directed robotic operation; therefore the location and size of holes is easily accomplished. Similarly, by molding the guide pin, the proper location of the protrusions is easily accomplished.

With the guide pin 5 mounted on the printed circuit board 10, the PCB 10 can be precisely coupled to another PCB 30 by placing the guide pin end 106 adjacent a hole 40, as illustrated in FIG. 2. The guide section 180 of the pin 5, having a diameter less than the hole 40, passes through the hole 40. The hole 40 includes a tapered section 205, tapering to a straight section 206. The guide section 180 is sized to pass through the straight section 206.

Although an illustrative version of the device is shown, it should be clear that many modifications to the device may be made without departing from the scope of the invention. For example, in alternative embodiments, the transverse cross-section of the protrusions may have another shape. Alternative shapes are shown in FIG. 12. At least one defined corner in the transverse cross-sectional shape is advantageous for biting into the material defining the recess on the PCB which receives the protrusion, as will be described below. Advantages are achieved by having two or more corners equally spaced about the circumference of the protrusion. By using a geometry with equally spaced corners, the tapered protrusion 100, 101 centers itself within the matering recess 65, 66.

As another example, the above description and the figures place the guide pin 5 on the first mobile PCB 10 and describes the pin 5 being received in the aperture 40 in a second PCB. It should be understood that the guide pin 5 may alternatively be affixed to the second PCB 30 that is a midplane, backplane, part of chassis or is otherwise immobile or semi-mobile.

I claim:

1. A method of attaching a guide pin to a printed circuit board comprising the steps of:
   a) providing a printed circuit board having two circular recesses and a screw hole defined therein;
   b) providing a guide pin having an elongate shaft defining a screw hole extending through the shaft member in a direction transverse to the shaft, said guide pin further including two tapered protrusions, square in transverse cross section, and sized in relation to the mating circular recess as follows:
      i) smaller in distance from corner to corner at its terminating end than the diameter of the circular recesses; and
      ii) greater in distance from corner to corner at its widest end than the diameter of the circular recesses;
   c) providing a mounting screw;
   d) positioning the guide pin adjacent the printed circuit board with said protrusions extending into said recesses;
   e) installing the mounting screw through the screw hole on the printed circuit board;
   f) tightening said mounting screw within said guide pin screw hole until corners of said protrusions bite into the printed circuit board.

2. A method according to claim 1, wherein said protrusions are of a material harder than the material of the printed circuit board.

3. A method of attaching a guide pin to a printed circuit board according to claim 1, wherein said screw hole is located between said protrusions.

4. A method of attaching a guide pin to a printed circuit board according to claim 1, wherein all sides of each said protrusion are oblique to their respective longitudinal axes.

5. A method of attaching a guide pin to a printed circuit board according to claim 1, wherein said protrusions are spaced a fixed distance from one another.

6. A method of attaching a guide pin to a printed circuit board according to claim 1, wherein each said protrusion has a cross-sectional shape that is constant in shape, while varying in size, through its taper in the direction along the longitudinal axis of the protrusion.

7. A guide pin for a printed circuit board comprising: an elongate shaft having a guide section coupled to an attachment section, said attachment section having a larger cross-sectional size than said guide section, and said attachment section including a PCB-engaging surface generally parallel to a longitudinal axis of said shaft and with two tapered protrusions extending from said PCB-engaging surface such that the longitudinal axis of said protrusions is perpendicular to the longitudinal axis of said shaft.

8. A guide pin according to claim 7, wherein said protrusions are square in cross-section.

9. A guide pin according to claim 7, wherein the cross-sectional shape of each said protrusion includes a defined corner.

10. A guide pin according to claim 7, wherein said guide pin defines a tapped hole therethrough that has a longitudinal axis parallel to the longitudinal axes of said protrusions.

11. A guide pin according to claim 7, wherein all sides of each said protrusion are oblique to their respective longitudinal axes.

12. A guide pin according to claim 7, wherein said protrusions are of a material harder than Flame Resistant 4 laminate.

13. A guide pin according to claim 7, wherein each said protrusion has a cross-sectional shape that is constant in shape, while varying in size, through its taper in the direction along the longitudinal axis of the protrusion.

14. A guide pin assembly, comprising:
   a) a printed circuit board having two recesses defined therein;
   b) a guide pin having an elongate shaft having a guide section coupled to an attachment section, said attachment section having a larger cross-sectional size than said guide section, and said attachment section including with a PCB-engaging surface generally parallel to a longitudinal axis of said shaft and with two tapered protrusions extending from said PCB-engaging surface such that the longitudinal axis of said protrusions is perpendicular to the longitudinal axis of said shaft; and said protrusions being received in said recesses.

15. A guide pin assembly according to claim 14, wherein said protrusions are of a material harder than the material of the printed circuit board immediately adjacent said recesses.

16. A guide pin assembly according to claim 14, wherein said protrusions are square in cross-section, and said protrusions are sized in relation to the mating recess on said circuit board as follows:
   i) smaller in distance from corner to corner at its terminating end than the diameter of the recesses; and
   ii) greater in distance from corner to corner at its widest end than the diameter of the recesses.

17. A guide pin assembly according to claim 14, wherein the cross-sectional shape of each said protrusion includes a defined corner, and wherein each said protrusion is sized in relation to the mating recess on said circuit board as follows:
   i) smaller in distance from its corner across its diameter at its terminating end than the diameter of the recesses; and
   ii) greater in distance from its corner across its diameter at its widest end than the diameter of the recesses.

18. A guide pin assembly according to claim 14, wherein said guide pin defines a tapped hole therethrough that has a longitudinal axis parallel to the longitudinal axes of said protrusions and wherein said printed circuit board defines a screw hole, said printed circuit board recesses and screw hole being positioned to mate with said guide pin protrusions and tapped hole.

19. A guide pin assembly according to claim 14, wherein all sides of each said protrusion are oblique to their respective longitudinal axes.

20. A guide pin assembly according to claim 14, wherein each said protrusion has a cross-sectional shape that is constant in shape, while varying in size, through its taper in the direction along the longitudinal axis of the protrusion.

21. A method of attaching a guide pin to a printed circuit board comprising the steps of:
   a) providing a printed circuit board having two recesses and a screw hole defined therein;
   b) providing a guide pin having an elongate shaft defining a screw hole extending through the shaft member in a direction transverse to the shaft, said guide pin further including two tapered protrusions;
   c) providing a mounting screw;
   d) positioning the guide pin adjacent the printed circuit board with said protrusions extending into said recesses;
   e) installing the mounting screw through the screw hole on the printed circuit board;
   f) tightening said mounting screw within said guide pin screw hole until corners of said protrusions bite into the printed circuit board.

22. A method of attaching a guide pin to a printed circuit board according to claim 21, wherein said protrusions are square in cross-section and said protrusions are sized in relation to the mating recess on said circuit board as follows:
   i) smaller in distance from corner to corner at its terminating end than the diameter of the recesses; and
   ii) greater in distance from corner to corner at its widest end than the diameter of the recesses.

23. A method of attaching a guide pin to a printed circuit board according to claim 21, wherein the cross-sectional shape of each said protrusion includes a defined corner, and wherein each said protrusion is sized in relation to the mating recess on said circuit board as follows:
   i) smaller in diameter from its corner across its diameter at its terminating end than the diameter of the recesses; and
   ii) greater in diameter from its corner across its diameter at its widest end than the diameter of the recesses.

24. A method of attaching a guide pin to a printed circuit board according to claim 21, wherein all sides of each said protrusion are oblique to their respective longitudinal axes.

25. A method of attaching a guide pin to a printed circuit board according to claim 21, wherein said protrusions are of a material harder than the material of the printed circuit board defining said recesses.

26. A method of attaching a guide pin to a printed circuit board according to claim 21, wherein each said protrusion has a cross-sectional shape that is constant in shape, while varying in size, through its taper in the direction along the longitudinal axis of the protrusion.

27. A method of attaching a guide pin to a printed circuit board according to claim 21 wherein said printed circuit board recesses are circular.

28. A guide pin for a printed circuit board comprising:
   a) an elongate shaft having a longitudinal axis;
   b) means for aligning and registering the guide pin for attachment to a first printed circuit board, said alignment means including a PCB-engaging surface generally parallel to a longitudinal axis of said shaft and with two tapered protrusions extending from said PCB-engaging surface such that the longitudinal axis of said protrusions is perpendicular to the longitudinal axis of said shaft;
   c) means for guiding said guide pin into a hole in a second printed circuit board.

29. A guide pin for a printed circuit board comprising: an elongate shaft having a longitudinal axis and having:
   a) a guide section;
   b) a middle section coupled to said guide section, said middle section having a larger diameter than said guide section with a first shoulder bridging said guide and middle sections; and
   c) an attachment section coupled to said middle section, said attachment section including a PCB-engaging surface generally parallel to a longitudinal axis of said shaft and with two tapered protrusions extending from said PCB-engaging surface such that the longitudinal axis of said protrusions is perpendicular to the longitudinal axis of said shaft.

* * * * *